US007270929B2

(12) United States Patent
Kwasny et al.

(10) Patent No.: US 7,270,929 B2
(45) Date of Patent: Sep. 18, 2007

(54) MEDIA FOR LASER IMAGING

(75) Inventors: David M Kwasny, Corvallis, OR (US); Makarand P. Gore, Corvallis, OR (US); Marshall Field, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 269 days.

(21) Appl. No.: 11/065,554

(22) Filed: Feb. 24, 2005

(65) Prior Publication Data

US 2006/0188828 A1 Aug. 24, 2006

(51) Int. Cl.
*G03E 1/765* (2006.01)
*G03C 5/16* (2006.01)
*G03F 7/00* (2006.01)
*G03F 7/004* (2006.01)

(52) U.S. Cl. .................. 430/138; 430/271.1; 430/290; 430/330; 430/346; 430/946; 430/964

(58) Field of Classification Search ................ 430/138, 430/346, 290, 330, 964, 946, 270.1, 271.1
See application file for complete search history.

(56) References Cited

U.S. PATENT DOCUMENTS

| | | | | | |
|---|---|---|---|---|---|
| 3,301,439 | A | * | 1/1967 | Kosar et al. | 222/52 |
| 4,504,565 | A | * | 3/1985 | Baldvins et al. | 430/138 |
| 4,816,367 | A | * | 3/1989 | Sakojiri et al. | 430/138 |
| 5,494,772 | A | * | 2/1996 | Hosoi et al. | 430/138 |
| 6,090,508 | A | | 7/2000 | Tsutsui et al. | |
| 6,531,230 | B1 | | 3/2003 | Weber et al. | |
| 6,643,001 | B1 | | 11/2003 | Faris | |
| 6,753,044 | B2 | | 6/2004 | Faris et al. | |
| 2003/0012562 | A1 | | 1/2003 | Lawandy et al. | |
| 2003/0035972 | A1 | | 2/2003 | Hanson et al. | |
| 2003/0179364 | A1 | | 9/2003 | Steenblik et al. | |
| 2003/0232179 | A1 | | 12/2003 | Steenblik et al. | |
| 2004/0146812 | A1 | | 7/2004 | Gore et al. | |
| 2004/0147399 | A1 | | 7/2004 | Gore | |

OTHER PUBLICATIONS

Dorozhkina, Galina; New PDLC-Films Doped by Black Dye, Mol. Cryst. and Liq. Cryst..2001., pp. 277-286, vol. 367, Overseas Publishers Association, USA.

* cited by examiner

*Primary Examiner*—Richard L. Schilling

(57) ABSTRACT

A method and a medium for laser imaging is herein disclosed. The medium incorporates one or more types of microstructures having a predetermined heat or radiation modifiable optical characteristic such as color, scattering, diffusion, diffraction, interference and iridescence. Associated intimately with the microstructures is a radiation antenna that acts to absorb radiation from a radiation source. The radiation antenna and source are attuned to one another to efficiently transfer energy therebetween and subsequently to the microstructures; this transfer of energy results in the modification of an optical characteristic of the microstructures to form an image on the medium. The medium has one or more layers that may include both the radiation antenna and the microstructures. Alternatively, the microstructures and radiation antenna may be included in separate layers. Coatings that incorporate one or more layers that include distinct microstructures and radiation antennae are also contemplated.

19 Claims, 7 Drawing Sheets

MEDIA FOR LASER IMAGING

TECHNICAL FIELD OF THE INVENTION

The present invention relates to media and mechanisms for laser imaging. More particularly the present invention relates to media having a substrate that incorporates microstructures that may be readily altered to effect the formation of images thereon. The present invention also includes a printing mechanism for forming images on the aforementioned media.

BACKGROUND OF THE INVENTION

The use of microstructures in printable media is well known. Most such arrangements utilize reflective microstructures to provide an image, pattern, or color that changes with the angle at which the media is viewed. The microstructures in question generally function by diffraction, interference, scattering, diffusion, transmission or reflection of light of a preselected wavelength or by polarizing reflected light. Other methods and structures for producing an optically discernable image, pattern, or color using microstructures are also known.

Generally, images, colors, or patterns are produced by directly applying or depositing microstructures onto the media in a desired arrangement prior to the use of the media, i.e. the images, colors, or patterns are printed on the media. Secondary images, colors, or patterns may be applied to the media over the pre-existing microstructural images, patterns, or colors. In other cases molding, stamping, patterning, pressure embossing, or mechanical abrasion of selected areas are used to produce the optical patterns. In recent times, high power lasers have also been used to ablate, melt, or otherwise damage the microstructures on the media to form a secondary image. In short, the formation of images on media using microstructures is relatively expensive, requires complicated and dangerous lasers, and/or may damage or chemically decompose the media being printed. Accordingly, there is a need for a media and a method of printing using microstructures that is inexpensive, flexible, and which uses apparatuses that are safe and which do not damage the media being printed.

It is therefore an object of the present invention to provide media having a substrate that may be readily modified using relatively low power light source sources. It is another object of the invention to provide media for printing having microstructural features that may be readily modified to form an image without damaging the substrate of the media. One other object of the present invention involves the provision of a printing apparatus that utilizes a relatively low power light/radiation source to form an image on media in such a way as to avoid damaging or chemically decomposing the media.

These and other objects, aspects, features and advantages of the present invention will become more fully apparent upon careful consideration of the following Detailed Description of the Invention and the accompanying Drawings, which may be disproportionate for ease of understanding, wherein like structure and steps are referenced generally by corresponding numerals and indicators.

BRIEF SUMMARY OF THE INVENTION

The present invention is realized in a printing medium, a printing mechanism and a method of printing in which microstructures having a chosen optical characteristic are applied to a printing medium. Radiation within a predetermined range of wavelengths is applied by a printing mechanism to the medium and is absorbed as heat energy by a radiation antenna that is selectively sensitive to the applied radiation.

The printing medium of the present invention generally includes a coated or uncoated substrate to which is applied a coating that incorporates microstructures having a selected optical characteristic, color, for example.

A printing mechanism of the present invention will include one or more source radiation sources that output light within a range of wavelengths to which a corresponding radiation antenna in the media is sensitive.

DETAILED DESCRIPTION

Figure 1:
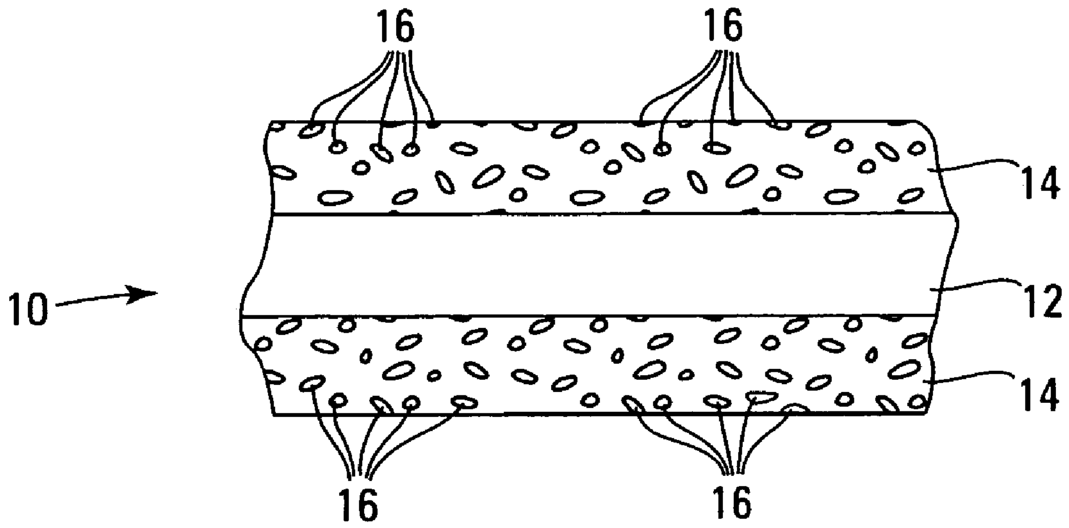
FIG. 1 is a cross sectional view of a printing medium in an embodiment of the present invention, the printing medium having a coating that incorporates microstructures therein.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The present invention generally includes a medium for printing and a method of printing that involves the use of certain types of microstructures in conjunction with radiation sources and radiation antennae. In a basic embodiment, a substrate of the printing media has applied thereto microstructures that impart a desired optical characteristic to the substrate. The microstructures have associated therewith a radiation antenna that facilitates the use of relatively low powered light sources, such as a light emitting diode laser or the like, to be used to develop or modify the desired optical characteristic of the microstructures, thereby forming an image on the media.

FIG. 1 illustrates one embodiment of the present invention in the media 10 having a substrate 12 to which is applied one or more layers 14. The layer(s) 14 includes microstructures 16 embedded in a carrier material that includes a compound or material, hereinafter referred to as a radiation antenna, which is generally uniformly dispersed within layer 14. The carrier material of layer 14 may include many useful materials such as binders, fillers, and colorants, in addition to the radiation antenna. Note that although FIG. 1 illustrates layer(s) 14 applied to both sides of the substrate 12, layer(s) 14 may be applied to one or both of the sides of the substrate 12.

Microstructures 16 impart one or more optical characteristics to the media 10. As used herein, the term "microstructure" may refer to discrete beads, chips, films, voids or bubbles, or fluid reservoirs that reflect and/or polarize light that is incident thereupon and three-dimensional structures formed in or on the layer(s) 14 on the surface of the of media 10 to impart a desired optical characteristic. Accordingly, the term "microstructure" is to be construed broadly and may include other types of structures and materials of similar function not specifically described herein. The term "optical characteristic" refers to any optically detectable characteristic of the media 10, including, but not limited to color, refraction, dispersion, iridescence, and other similar optical characteristics. Note that optical characteristics include optical features that are visible to the human eye and to optical devices.

In one embodiment, the carrier material of layer 14 is relatively opaque and therefore only microstructures 16 on the surface of layer 14 will impart their optical characteristics to the media 10. In another embodiment, the carrier material of layer 14 may be at least partially transmissive with respect to incident radiation and in this circumstance, most or all of the microstructures 16 present in layer 14 will impart their optical characteristics to the media 10.

The carrier material containing the microstructures 16 may be applied to one or both sides of the substrate 12. The carrier material may be applied to the entire surface of the substrate 12 using a typical wet end coating process such as a doctor blade, screen printer, roller coater, offset printing, pad printing, spray coating, spin coating, gravure, curtain coating, slot-die coating, ink jet printing and the like. Alternatively, microstructures 16 may be applied to the surface of the substrate 12 in a selective manner as by printing or screening or may be formed separately from the substrate 12 as a planar film (not shown) that is later laminated therewith to form an image or pattern thereon. Hereinafter, the application of microstructures 16 to a substrate 12 will be referred to as the formation of a first image. The first image may include, but is not limited to, solid colors, regular and irregular patterns, line art, and text. In some embodiments, the layer 14 having microstructures 16 in a carrier material may be used simply to impart a desired finish and color to a sheet of paper. In other embodiments, layer 14 having microstructures 16 in a carrier material may be used to form various types of security features common to sensitive documents such as bank notes and the like.

The substrate 12 of the media 10 may be any suitable substrate including, but not limited to, paper, films, cloth, wood, metal and the like. The substrate 12 may have preexisting coatings applied thereto prior to the application of a layer 14 thereto. Once layer 14 has been applied to the substrate 12 and properly cured or otherwise treated to allow further processing, a second image may be formed on the media 10 by modifying the optical characteristic(s) of the microstructures 16. This is done by chemically curing or developing the microstructures (where the microstructures are photosensitive) or by heating the microstructures 16 to a point at which their optical characteristics are modified in a desired manner. Modifying the microstructures 19 may also be referred to as 'developing' the second image on the media 10. In some embodiments, heating the microstructures 16 may result in the layer 14 becoming transmissive, thereby resulting in those portions of the media 10 where the modified microstructures reside effectively taking on at, at least partially, an optical characteristic of the substrate 12 or underlying layers 14, for example color. In one embodiment, microstructures 16 may be adapted to reflect and diffuse substantially all visible light, thereby imparting a "white" color to the media 10. In some embodiments, this is accomplished by forming or applying a grating line pattern on the surface of the media 10.

By curing or heating one or more of the microstructures 16 to a predetermined point, the microstructures 16 are modified such that they reflect only light in chosen wavelengths, thereby imparting a different color to that portion of the media where the modified microstructures reside. In some embodiments, the microstructures 16 may, after heating, become absorptive of substantially all visible light and will therefore render black those portions of the media 10 where the modified microstructures reside. It is to be understood that the starting and ending optical characteristics of the microstructures 16 may vary depending on the physical or chemical makeup of the microstructures themselves. Accordingly, such optical characteristics as color and reflectance, among others, may vary between different types of microstructures.

The present invention utilizes a radiation source and a radiation antenna that are attuned to one another to precisely and efficiently transfer energy from the source to the antenna in a selected portion of the media 10 to modify the optical characteristics of the microstructures. Radiation antennae that absorb light energy within a specified range of wavelengths and either pass or reflect substantially all other wavelengths of light are incorporated in and/or around the microstructures 16. In the embodiment illustrated in FIG. 1, the radiation antenna is incorporated directly into the carrier material of layer 14 such that the radiation antenna surrounds or is at least immediately adjacent to or within the microstructures 16. The radiation source outputs substantially only light within the predetermined range of wavelengths to which the radiation antenna is attuned. As substantially all of the light that is incident upon the media 10 is of a wavelength that can and likely will be absorbed, there is realized a highly efficient transfer of energy from the radiation source to the media 10 and more specifically, to the microstructures themselves. Accordingly, much less power is required from the radiation sources than was otherwise required in prior art laser printing devices utilizing microstructures. Furthermore, because the energy transfer from the radiation source to the radiation antenna takes place immediately adjacent to the microstructures themselves, only minutely localized heating of the layer 14 is required. This localized heating/development eliminates or at least limits damage to the media 10 and avoids problems such as burning and delamination of the layers 14 from the substrate 12.

Figure 6:
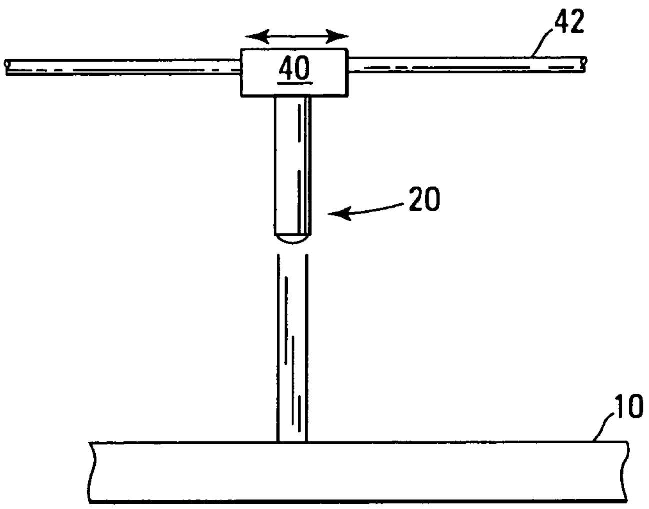
FIG. 6 is a schematic illustration of a printing mechanism in an embodiment of the present invention, the printing mechanism having a single radiation source mounted to a printhead.

As illustrated in FIG. 6, a radiation source 20 delivers light to a selected portion of the media 10 to modify or develop the optical characteristics of the microstructures in that selected portion. One or more radiation sources 20 may be adapted for use in a printing mechanism 30 of the type illustrated in FIG. 6. In one embodiment, the radiation source 20 is a laser powered by a light emitting diode. Such lasers are very inexpensive and because their power output is relatively low, these lasers are less likely to damage the media 10 or cause unsafe conditions. This type of radiation source 20 is also quite flexible as it may be readily attuned through known means to output light in many different ranges of wavelengths.

Figure 2:
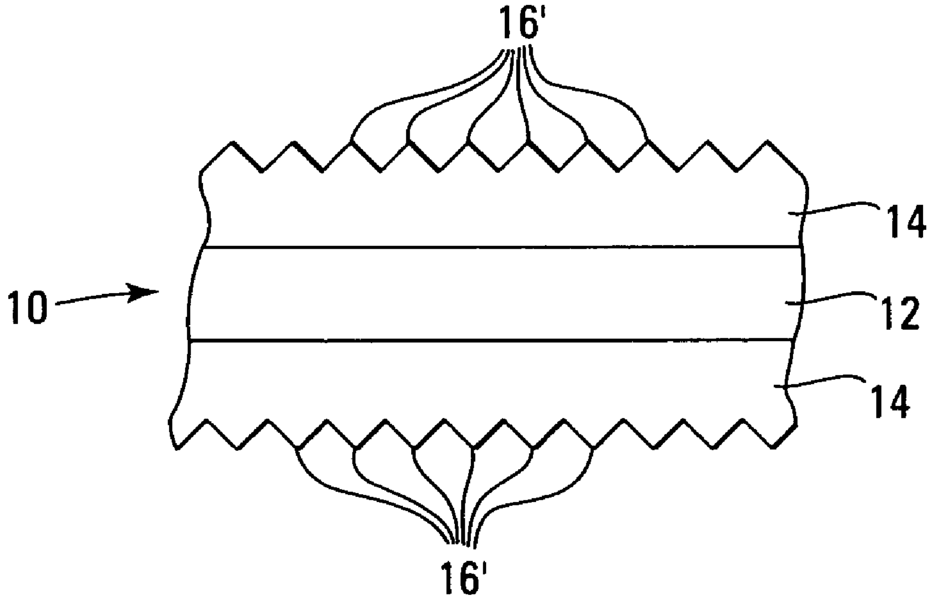
FIG. 2 is a cross sectional view of a printing medium in an embodiment of the present invention, the printing medium having a coating with microstructures formed on the surface of the coating.

FIG. 1 illustrates the use of a microstructure 16 that is a discrete structure incorporated into a carrier material for application to a substrate 12 in a layer 14. FIG. 2 illustrates the formation of a three-dimensional microstructure 16' into the surface of the media 10. Microstructures 16' are constructed and arranged to reflect and/or diffract incident light to impart their selected optical characteristics. Modifying the physical structure of the microstructures 16' necessarily modifies their optical characteristics.

The embodiment shown in FIG. 2 is similar to the embodiment of FIG. 1 in that both have a substrate 12 to which on or more layers 14 have been applied. Layers 14 may have many constituent parts, but always include a radiation antenna as described above. The layers 14 may be applied directly to a bare or uncoated substrate 12 or may be applied to a substrate 12 having one or more pre-existing coatings applied thereto. Note that layers 14 may be applied using any of a number of wet end coating methodologies. Samples of some suitable coating methodologies are described in The Printing Ink Manual; Leach, Robert; Pierce, Ray (Eds.), Fifth Edition, 1999, 993 p., ISBN: 0-948905-81-6, herein incorporated by reference. Alternatively, microstructures 16 may be selectively applied by printing, screening, embossing, engraving, or may be formed as an independent layer or film and later laminated to substrate 12.

Microstructures 16' may be formed by many methods including, but not limited to, engraving, pressing, ablation, etching, selective deposition as by printing or screening, or by including the microstructures 16' in an independent layer or film that is laminated to substrate 12. Three dimensional microstructures 16' are typically formed in the surface of the layer 14, though it is to be understood that where multiple translucent layers 14 are applied to a substrate 12, it may be possible to form three dimensional microstructures 16' at the interface between the respective layers 14. Microstructures 16' have their optical characteristics modified in the same manner as described above in conjunction with FIG. 1. Light or radiation within a specified range of wavelengths from a radiation source 20 is played upon a predetermined location of the media 10 and is readily absorbed by the attuned radiation antenna in layer(s) 14. The energy from the radiation source 20 efficiently heats the microstructures 16' to a point where the three-dimensional structure of the microstructures 16', and hence their optical characteristics, are modified. In this manner, a secondary image is formed on the media 10.

Figure 3:
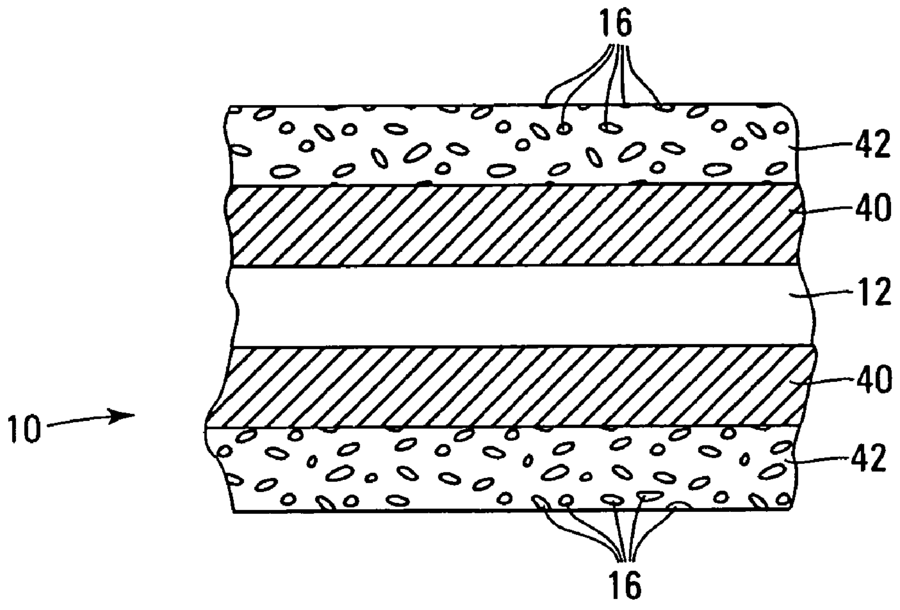
FIG. 3 is a cross sectional view of a printing medium in an embodiment of the present invention, the printing medium having multiple coatings that incorporate discrete microstructures therein.

FIG. 3 illustrates another embodiment of the media 10 in which the radiation antenna is contained in a layer 40 that is separate from the layer 42 in which the discrete microstructures 16 are disposed. As previously described, one or more layers 40 are applied to one or more sides of a substrate 12 that may or may not have pre-existing coatings (not shown) applied thereto. Layer(s) 40 includes, among other things, a radiation antenna that is disposed within a carrier material that may itself include other typical constituent parts such as binders, fillers, and the like. A layer 42, which includes microstructures 16 disposed within a carrier material, may be applied over one or both layers 40, depending on how many such layers 40 are laid down on substrate 12. Note that the relative positions of the layers 40 and 42 may be reversed so long as light from a radiation source may be directed onto the radiation antenna and the radiation antenna can transfer heat to the microstructures 16. Note also that where the radiation antenna and the microstructures 16 are disposed in separate layers as illustrated in FIG. 3, and particularly for those embodiments where the radiation antenna is disposed in a layer away from the surface of the media 10, it will be desirable for the outermost layer, in the embodiment illustrated in FIG. 3 layer 42, to be at least partially transmissive with respect to light from the radiation source 20. In this manner, light from the radiation source 20 will pass through layer 42 and will be absorbed by the light absorbing material in layer 40, which in turn transfers heat to the microstructures 12 in layer 42 to modify their optical characteristics.

Figure 4:
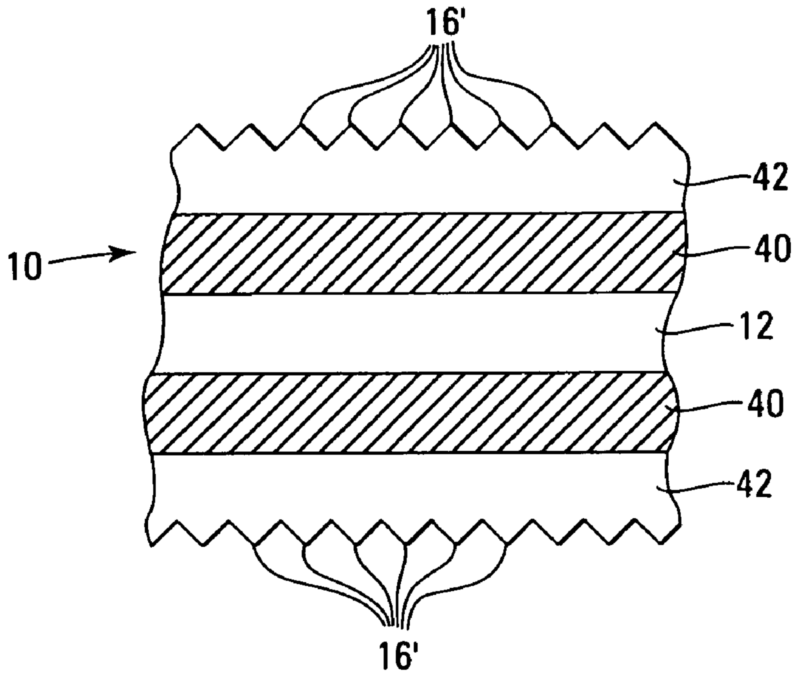
FIG. 4 is a cross sectional view of a printing medium in an embodiment of the present invention, the printing medium having multiple coatings, at least one of which incorporates microstructures therein and another coating having microstructures formed on the surface thereof.

FIG. 4 illustrates another embodiment of the media 10 that utilizes three-dimensional microstructures 16' in a layer separate from the layer in which is disposed the radiation antenna. In the embodiment of FIG. 4, one or more layers 42 are applied to the substrate 12, which may or may not have pre-existing coatings applied thereto. Layer 42 includes a carrier material in which is disposed a radiation antenna as described above in conjunction with FIG. 3. One or more layers 42 are applied over the layers 40 applied to the substrate 12. Layers 42 have formed on outer surface thereof three-dimensional microstructures 16' that have one or more desired optical characteristics. Light from a radiation sources played upon a selected portion of the media 10 and is absorbed by the radiation antenna of layer 40, which in turn transfer heat to the microstructures 16' of layer 42 to modify the optical characteristics of the microstructures 16'. In this embodiment, it will be necessary for layer 42 to be at least partially transmissive with respect to the light output by the radiation sources that the optical characteristics of the microstructures 16' may be modified to form a secondary image on the media 10.

Figure 5:
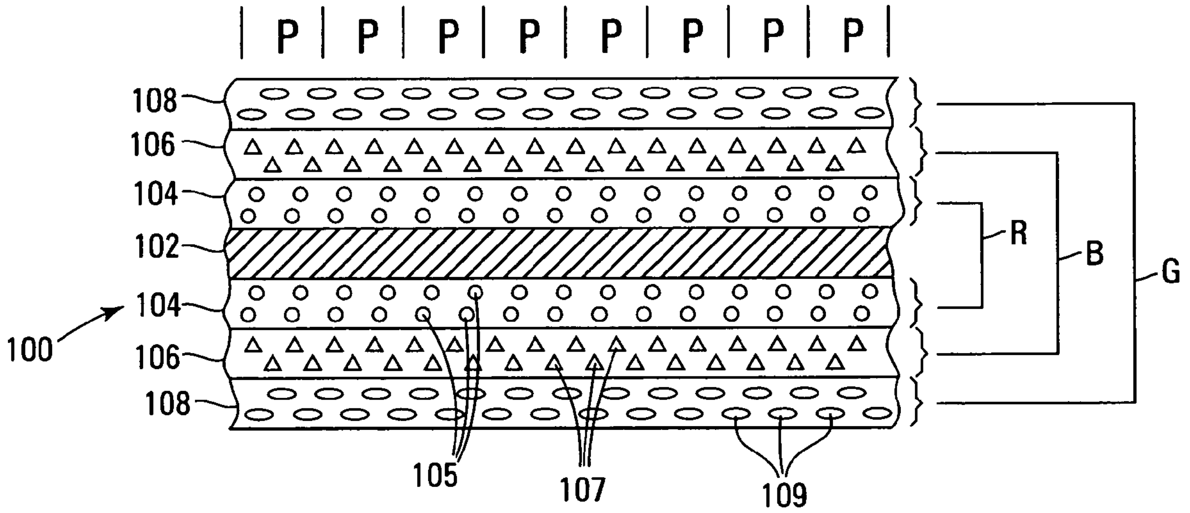
FIG. 5 is a cross sectional view of a printing medium in an embodiment of the present invention, the printing medium having multiple coatings containing discrete microstructures, the coatings being adapted for multicolor printing.

FIG. 5 illustrates one embodiment of media 100 intended for multicolor printing. Media 100 has a substrate 102 to which are applied multiple layers 104, 106, and 108 that incorporate radiation antennas and microstructures. Note that layers 104, 106, and 108 are applied to both sides of substrate 102 so that the resulting media 10 may be used in a duplex printing process. It is to be understood however, that layers 104, 106, and 108 may be applied to only a single side of substrate 102. Prior to the application of layers 104, 106, and 108, substrate 102 may be uncoated or may have one or more pre-existing coatings (not shown) applied thereto.

Each of the layers 104, 106, and 108 comprise a carrier material that may include binders, fillers, and other constituent parts, including respective radiation antennas and microstructures 105, 107, and 109. The radiation antennas of each layer 104, 106, and 108 are attuned to radiation in substantially mutually exclusive ranges of wavelengths. Radiation played upon the media 100 that is outside of the sensitive range of wavelengths for a given layer 104, 106, or 108 will not be absorbed by the radiation antenna thereof, but will be partially or wholly passed therethrough and/or partially reflected. Because the multiple layers 104, 106, and 108 are applied the one over the other, it is important that the outer layers be at least partially transmissive with respect to light output by the radiation sources to which the inner layers are sensitive. In this manner, light from the radiation sources may be directed at the radiation antenna of a chosen layer through the outer layers such that all or part of a secondary image can be formed by modifying the microstructures that reside in the chosen layer.

In one embodiment of the media 100, pair R of layers 104 include microstructures 105 that are constructed and arranged to reflect red light upon modification, pair B of layers 106 include microstructures 107 that are constructed and arranged to reflect blue light upon modification, and pair G of layers 108 include microstructures 109 that are constructed and arranged to reflect green light upon modification. In their unmodified state, microstructures 105, 107, and 109 may reflect all light incident upon media 100, thereby giving the media a white color, or the microstructures may be transmissive of light incident upon media 100 such that the inherent color of the substrate 102 will define the color of the media 100 before any of the microstructures are modified. Note that the microstructures of layers 104, 106, and 108 may take on any suitable color or optical characteristic and are not limited to the colors/optical characteristics described above.

A secondary image is printed upon media 100 in the same manner as described herein above in conjunction with FIGS. 1-4. Where a portion of an image, pattern, or text is to be printed on media 100 in one or a combination of the colors/characteristics represented by layers 104, 106, and 108, the radiation sources that are attuned to the selected layers are activated to play light on the desired portion of the media 100. Where, for example, the portion of the image that is to be printed on the selected portion of media 100 is to be red, the radiation source that outputs light to which the radiation antenna of layers 104 is sensitive is activated. A sufficient portion of light from the selected radiation source passes through layers 106 and 108 and is incident upon layer 104 such that the radiation antenna absorbs the light. Heat is transferred from the radiation antenna of layer 104 to the microstructures 105 thereof, which are modified to exhibit the desired optical characteristic, in this instance the characteristic being to be reflective of red light. The microstructures 107 and 109 of the blue and green pairs of layers, B and G, may be similarly modified.

Media 100 may be divided into a grid of locations or pixels P. Each of the pixels P may be colored as described above by modifying the optical characteristics of the microstructures in the layers 104, 106, and 108 of the media 100 at pixel P. Radiation sources may be operated as by a controller (not shown) of printer 30 to form a pattern of colored or modified pixels P across the surface of the media 100 to form a desired image without requiring the application of a colorant such as an ink, dye, or toner to the surface of the media 100.

Figure 7:
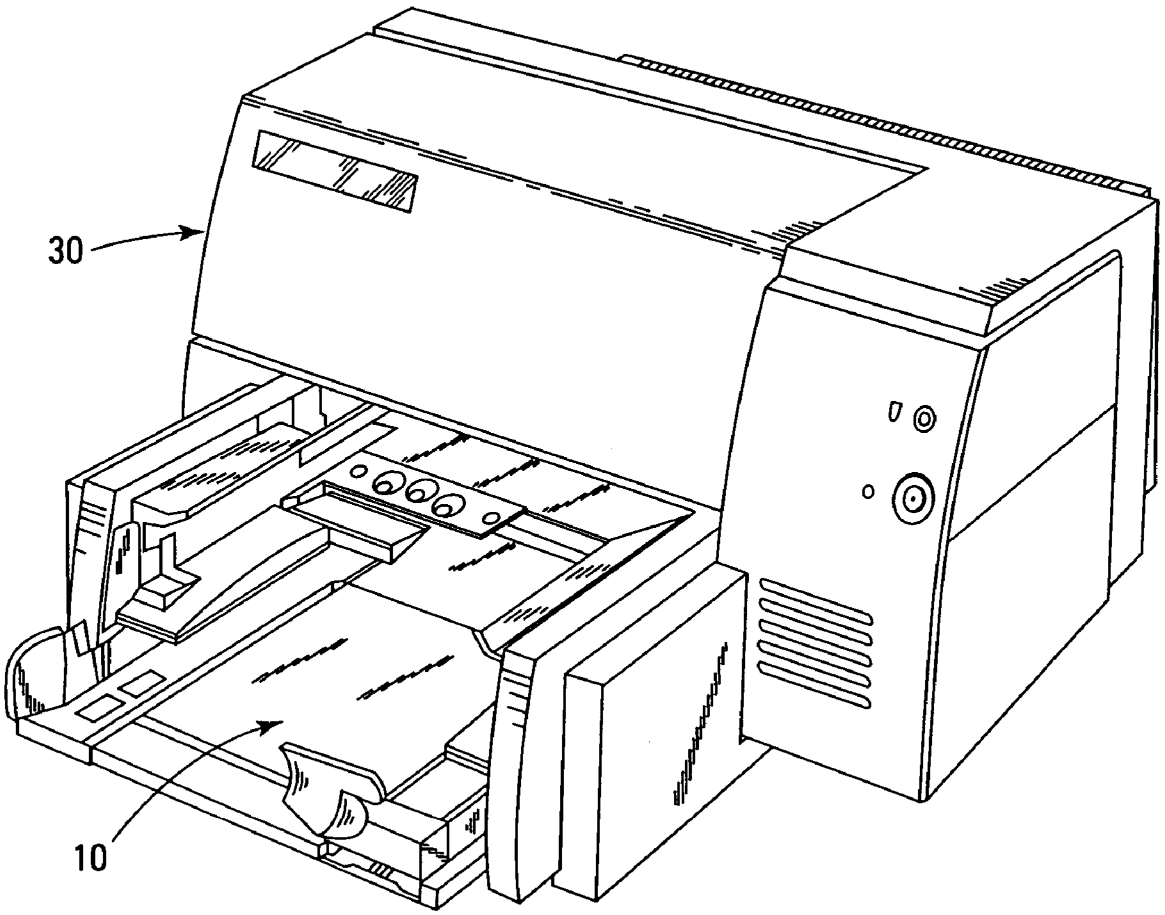
FIG. 7 is an illustration of a printing mechanism in an embodiment of the present invention, the printing mechanism of a type that may incorporate a radiation source.

FIG. 7 illustrates schematically a printing mechanism 30 adapted to carry out a printing process on media 10 according to one or more embodiments of the present invention. Printer 30 may be adapted for use as a line type printer or may incorporate one or more movable printhead, each printhead incorporating in turn one or more radiation sources 20. Note that as printing processes according to the present invention may be carried out in myriad ways, it is to be understood that the present invention is not limited to printers 30 having a configuration similar to that illustrated in FIG. 7.

Figure 8:
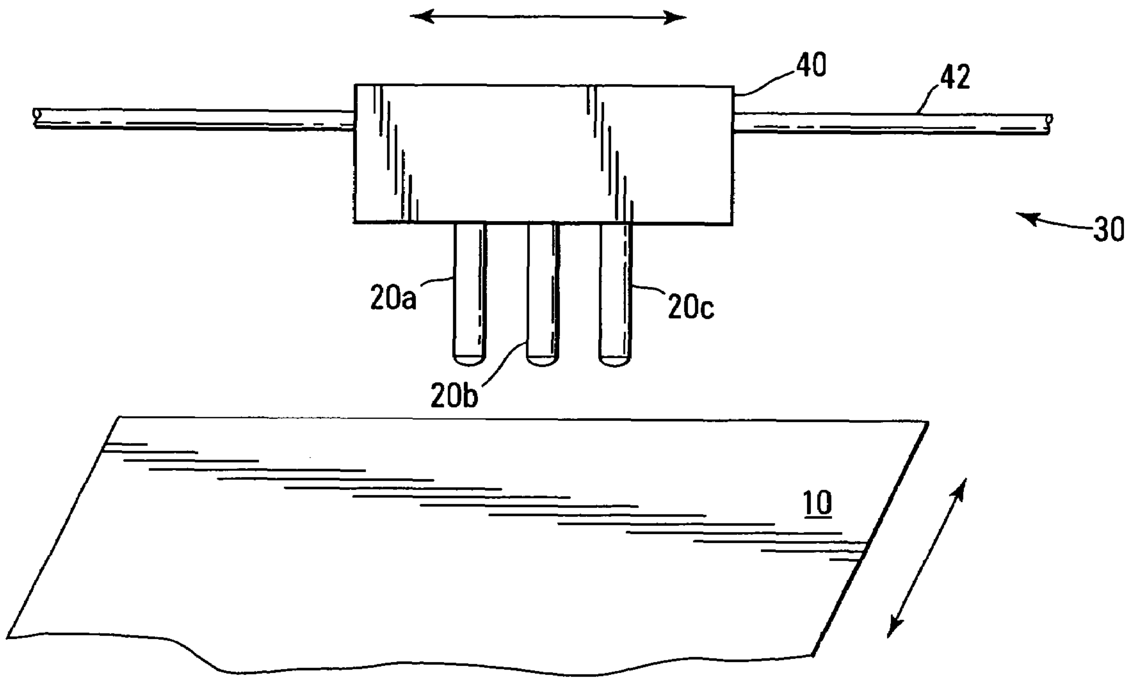
FIG. 8 is a schematic illustration of a printer in an embodiment of the present invention, the printer having multiple radiation sources mounted to a printhead.

FIGS. 6 and 8 illustrate schematically embodiments of a printer 30 that has a printhead 40 mounted upon shaft 42. Printhead 40 is laterally movable with respect to media 10 upon shaft 42 and media 10 may be moved with respect to the printhead 30 by a media handling mechanism (not shown). A number of printer architectures of a type that may be adapted to control the relative positions of a printhead 40 and media 10 are described by Bockman et al. in their article "HP DeskJet 1200C Printer", Hewlett-Packard Journal, February 1994, pages 55-66, hereby incorporated by reference. Note that other printer architectures may also be used or adapted.

Printhead 40 includes one or more radiation sources 20*a*, 20*b*, and 20*c* that output light within predetermined ranges of wavelengths as described hereinabove. The radiation sources 20*a*, 20*b*, and 20*c* may each be adapted to output light in different wavelength ranges, or in the same wavelength ranges, depending on whether the printhead 40 is intended for multicolor printing or the multiple radiation sources 20*a*, 20*b*, and 20*c* are simply intended to support one another in a single color printing operation. In use, the printhead 40 and media 10 are manipulated by the printer 30 to align the radiation sources 20*a*, 20*b*, and 20*c* with a desired location on the media 10. One or more of the radiation sources 20*a*, 20*b*, and 20*c* are then activated to play light upon the media 10. The light from radiation sources 20*a*, 20*b*, and 20*c* is absorbed by the respective radiation antennas in or on the media 10, the light energy being absorbed thereby as heat that modifies the selected microstructures to create a secondary image on the media 10.

Figure 9:
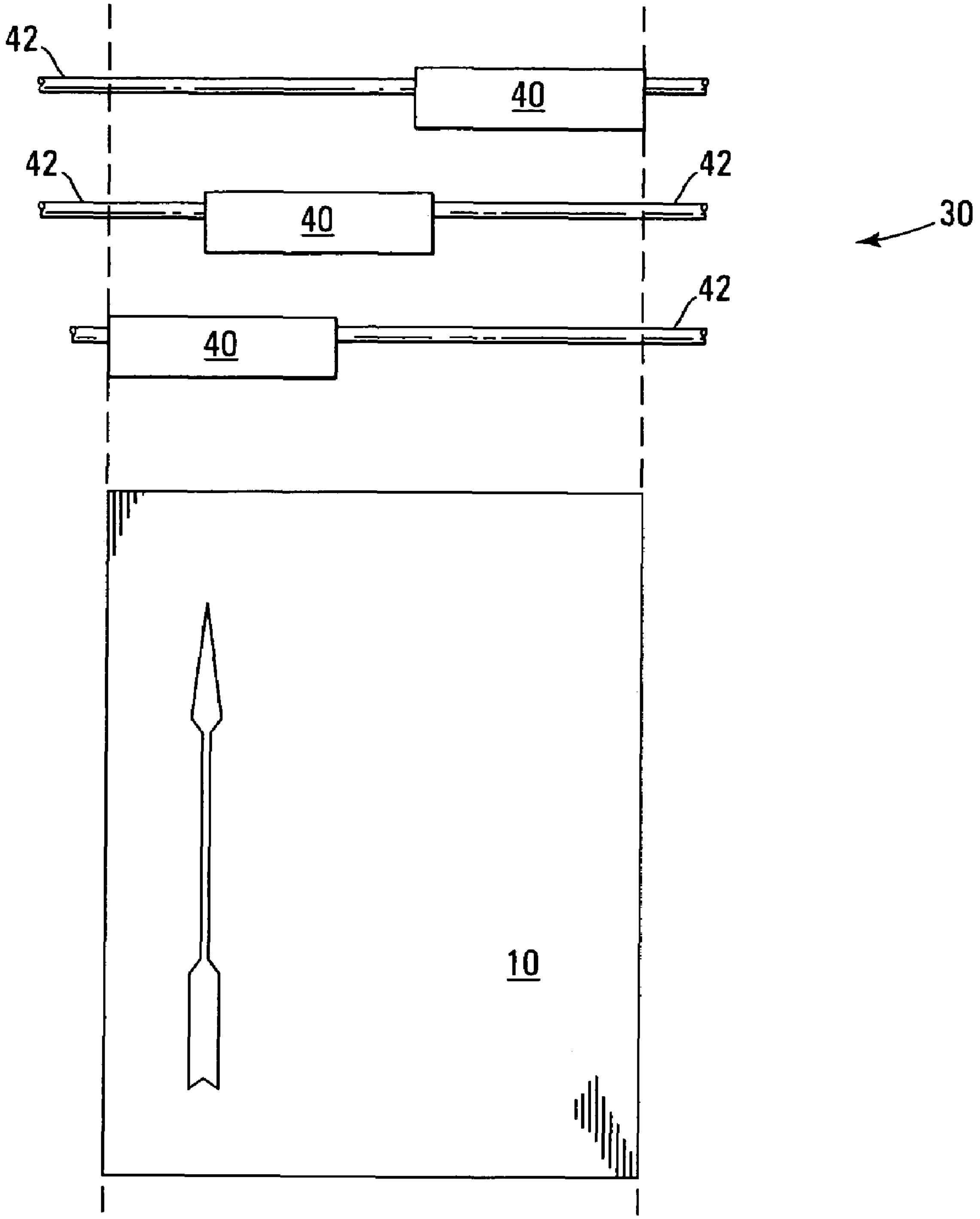
FIG. 9 is a schematic illustration of a printer in an embodiment of the present invention, the printer having multiple printheads that may be adapted to mount thereon one or more radiation sources.

While the radiation sources 20*a*, 20*b*, and 20*c* in FIG. 9 may be arranged in a parallel fashion as shown, it may be desirable to provide a mounting structure (not shown) in the printhead 40 that will not only provide the necessary electrical and/or control connections between the radiation sources 20*a*, 20*b*, and 20*c* and the printer 30, but will also focus the respective radiation sources 20*a*, 20*b*, and 20*c* on the same location of the media 10.

FIG. 9 illustrates schematically another embodiment of a printer 30 that incorporates multiple printheads 40, each mounted for lateral movement on respective shafts 42. The multiple printheads 40 may operate independently of one another, each of the printheads 40 operating alone to print an image on media 10. Alternatively, each of the multiple printheads 40 may be adapted and controlled by printer 30 to operate cooperatively to print a secondary image on media 10. Note that the printheads 40 illustrated in FIG. 10 may collectively operate as a line type printhead or may operate individually.

Figure 10:
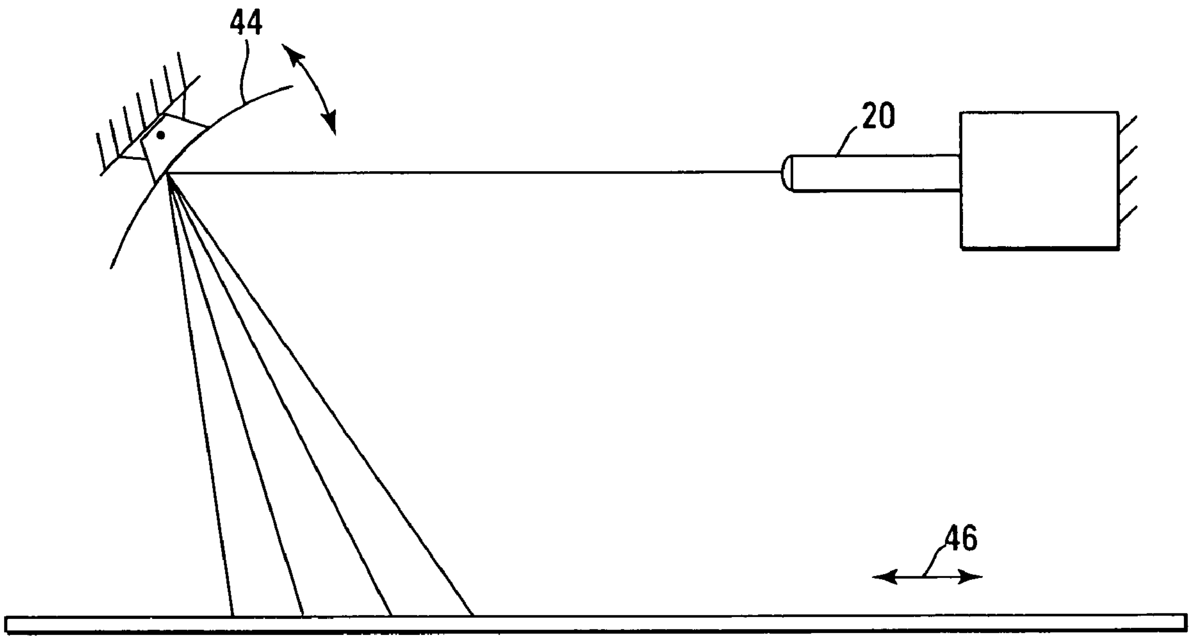
FIG. 10 is a schematic illustration of a reflector in an embodiment of the present invention, the reflector used to reflect light from a radiation source onto a printing medium.

FIG. 10 illustrates schematically an embodiment of the present invention in which a radiation source 20 is fixedly mounted within a printer (not shown). Light output by the radiation source 20 is collected by a reflector 44 that is rotatively mounted to reflect and focus the light from the radiation source 20 onto the media 10 as shown. The reflector 20 may be rotated about a single axis, as shown, or may be adapted for rotation about multiple axes. As media 10 moves with respect to the radiation source 20 and reflector 44 (see arrow 46), radiation from the radiation source 20 is played across the surface of the media 10 to form a secondary image.

As described hereinabove, the radiation antennae act as an efficient energy absorber and are included in the carrier material as a component that optimizes the development of the microstructures upon exposure to radiation at a predetermined exposure time and/or wavelength. In one embodiment, the radiation source and radiation antenna will be optimized to develop the microstructures on the media 10 over a range of wavelengths of about 200 nm to about 900 nm. It is to be understood however, that wavelengths outside this range can be used by adjusting composition or other characteristics of the radiation antenna and/or the radiation source.

Suitable radiation antennae can be selected from a number of radiation absorbing materials such as, but not limited to, aluminum quinoline complexes, porphyrins, porphins, indocyanine dyes, phenoxazine derivatives, phthalocyanine dyes, polymethyl indolium dyes, polymethine dyes, guaiazulenyl dyes, croconium dyes, polymethine indolium dyes, metal complex IR dyes, cyanine dyes, squarylium dyes, chalcogeno-pyryloarylidene dyes, indolizine dyes, pyrylium dyes, quinoid dyes, quinone dyes, azo dyes, and mixtures or derivatives thereof. Other suitable radiation antennae can also be used in the present invention and are known to those skilled in the art and can be found in such references as "Infrared Absorbing Dyes", Matsuoka, Masaru, ed., Plenum Press, New York, 1990 (ISBN 0-306-43478-4) and "Near-Infrared Dyes for High Technology Applications", Daehne, Resch-Genger, Wolfbeis, Kluwer Academic Publishers (ISBN 0-7923-5101-0), both incorporated herein by reference.

Suitable radiation antennae efficiently absorb electromagnetic radiation of a specific wavelength or range of wavelengths. Optimization of a coupled radiation source and radiation antenna involves utilizing a radiation source that emits radiation substantially at or near the wavelength that the radiation antenna most efficiently absorbs. In one embodiment for example, the development of the microstructures is optimized within a range of wavelengths that includes infrared radiation from about 720 nm to about 900 nm. Common CD-burning lasers have a wavelength of about 780 nm and can be adapted for use as a radiation sources for developing selected microstructures on the media 10. Examples of radiation antennae that are suitable for use in the infrared range can include, but are not limited to, polymethyl indoliums, metal complex IR dyes, indocyanine green, polymethine dyes such as pyrimidinetrione-cyclopentylidenes, guaiazulenyl dyes, croconium dyes, cyanine dyes, squarylium dyes, chalcogenopyryloarylidene dyes, metal thiolate complex dyes, bis(chalcogenopyrylo)polymethine dyes, oxyindolizine dyes, bis(aminoaryl)polymethine dyes, indolizine dyes, pyrylium dyes, quinoid dyes, quinone dyes, phthalocyanine dyes, naphthalocyanine dyes, azo dyes, hexafunctional polyester oligomers, heterocyclic compounds, and combinations thereof. Several specific polymethyl indolium compounds are available from Aldrich Chemical Company and include 2-[2-[2-chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium perchlorate; 2-[2-[2-Chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium chloride; 2-[2-[2-chloro-3-[(1,3-dihydro-3,3-dimethyl-1-propyl-2H-indol-2-ylidene)ethylidene]-11-cyclohexen-1-yl]ethenyl]-3,3-dimethyl-1-propylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium perchlorate; 2-[2-[3-[(1,3-dihydro-3,3-dimethyl-1-propyl-2H-indol-2-ylidene)ethylidene]-2-(phenylthio)-1-cyclohexen-1-yl]ethenyl]-3,3-dimethyl-1-propylindolium perchlorate; and mixtures thereof. Alternatively, the radiation antenna can be an inorganic compound, e.g., ferric oxide, carbon black, selenium, or the like. Polymethine dyes or derivatives thereof such as a pyrimidinetrione-cyclopentylidene, squarylium dyes such as guaiazulenyl dyes, croconium dyes, or mixtures thereof can also be used in the present invention. Suitable infrared sensitive pyrimidinetrione-cyclopentylidene radiation antennae include, for example, 2,4,6(1H,3H,5H)-pyrimidinetrione 5-[2,5-bis[(1,3-dihydro-1,1,3-dimethyl-2H-indol-2-ylidene)ethylidene]cyclopentylidene]-1,3-dimethyl-(9CI) (S0322 available from Few Chemicals, Germany)

In another embodiment, a radiation antenna can be selected to optimize the development of microstructures on the media 10 in a wavelength range from about 600 nm to about 720 nm and more specifically at about 650 nm. Non-limiting examples of suitable radiation antennae for use in this range of wavelengths can include indocyanine dyes such as 3H-indolium, 2-[5-(1,3-dihydro-3,3-dimethyl-1-propyl-2H-indol-2-ylidene)-1,3-pentadienyl]-3,3-dimethyl-1-propyl-,iodide), 3H-indolium, 1-butyl-2-[5-(1-butyl-1,3-dihydro-3,3-dimethyl-2H-indol-2-ylidene)-1,3-pentadienyl]-3,3-dimethyl-,perchlorate, and phenoxazine derivatives such as phenoxazin-5-ium, 3,7-bis(diethylamino)-,perchlorate. Phthalocyanine dyes such as silicon 2,3-napthalocyanine bis(trihexylsilyloxide) and matrix soluble derivatives of 2,3-napthalocyanine (both commercially available from Aldrich Chemical), matrix soluble derivatives of silicon phthalocyanine (as described in Rodgers, A. J. et al., 107 J. Phys. Chem. A 3503-3514, May 8, 2003), matrix soluble derivatives of benzophthalocyanines (as described in Aoudia, Mohamed, 119 J. Am. Chem. Soc. 6029-6039, Jul. 2, 1997), phthalocyanine compounds such as those described in U.S. Pat. Nos. 6,015,896 and 6,025,486 (which are each incorporated herein by reference), and Cirrus 715, a phthalocyanine dye available from Avecia, Manchester, England, may also be used.

In another embodiment, a radiation source such as a laser that outputs light having blue and indigo wavelengths ranging from about 300 nm to about 600 nm can be used to develop the microstructures on the media 10. In particular, radiation sources such as the lasers used in certain DVD and laser disk recording equipment emit energy at a wavelength of about 405 nm. Radiation antennae that most efficiently absorb radiation in these wavelengths may include, but are not limited to, aluminum quinoline complexes, porphyrins, porphins, and mixtures or derivatives thereof. Some specific examples of suitable radiation antennae suitable for use with radiation sources that output radiation between 300 and 600 nm include 1-(2-chloro-5-sulfophenyl)-3-methyl-4-(4-sulfophenyl)azo-2-pyrazolin-5-one disodium salt; ethyl 7-diethylaminocoumarin-3-carboxylate; 3,3'-diethylthiacyanine ethylsulfate; 3-allyl-5-(3-ethyl-4-methyl-2-thiazolinylidene) rhodanine (each available from Organica Feinchemie GmbH Wolfen), and mixtures thereof. Other examples of suitable radiation antennae include aluminum quinoline complexes such as tris(8-hydroxyquinolinato) aluminum (CAS 2085-33-8) and derivatives such as tris(5-cholor-8-hydroxyquinolinato) aluminum (CAS 4154-66-1), 2-(4-(1-methyl-ethyl)-phenyl)-6-phenyl-4H-thiopyran-4-ylidene)-propanedinitril- 1,1-dioxide (CAS 174493-15-3), 4,4'-[1,4-phenylenebis(1,3,4-oxadiazole-5,2-diyl)]bis N,N-diphenyl benzeneamine (CAS 184101-38-0), bis-tetraethylammonium-bis(1,2-dicyano-dithiolto)-zinc(II) (CAS 21312-70-9), 2-(4,5-dihydronaphtho[1,2-d]-1,3-dithiol-2-ylidene)-4,5-dihydro-naphtho[1,2-d]1,3-dithiole, all available from Syntec GmbH. Other examples of specific porphyrin and porphyrin derivatives can include etioporphyrin 1 (CAS 448-71-5), deuteroporphyrin IX 2,4 bis ethylene glycol (D630-9) available from Frontier Scientific, and octaethyl porphrin (CAS 2683-82-1), azo dyes such as Mordant Orange CAS 2243-76-7, Merthyl Yellow (60-11-7), 4-phenylazoaniline (CAS 60-09-3), Alcian Yellow (CAS 61968-76-1), available from Aldrich chemical company, and mixtures thereof.

FIG. 11 illustrates another embodiment of media 120 that may include photosensitive curable polymers such as acrylate derivatives, oligomers, and monomers. These photosensitive curable polymers, such as, for example, certain lacquers, are deposited as a layer 122 on a medium 121. The layer 122 may incorporate a separate radiation antenna or the curable polymer may itself be a radiation antenna of sorts. Coatings or layers 122 may have incorporated therewith microstructures or may be independent from layers 124 that include microstructures. The absorption of energy by the radiation antenna in layer 122 initiates a chemical reaction(s) that cures the curable polymer. In one embodiment, radiation antennae used in conjunction with the curable polymers are selected for curing the aforementioned polymers using ultraviolet (UV) or electron beam curing systems and may include, by way of example, benzophenone derivatives. Other examples of radiation antennae that are useful as photoinitiators for free radical polymerization monomers and pre-polymers can include, but are not limited to, thioxanethone derivatives, anthraquinone derivatives, acetophenones, and benzoine ethers. Additional examples of UV curable polymers that may be prepared and coated as dispersions in water or solvents, solutions, or solid melts include polyvinyl alcohol, polyvinyl chloride, polyvinyl butyral, cellulose esters and blends such as cellulose acetate butyrate, polymers of styrene, butadiene, ethylene, poly carbonates, polymers of vinyl carbonates such as CR39, available from PPG industries, Pittsburgh, and co-polymers of acrylic and allyl carbonate momoners such as BX-946, available form Hampford Research, Stratford, Conn. These polymers can be dissolved, dispersed, ground and deposited in coatings and films that may be formed or applied to media 120 using commonly known processes such as solvent or carrier evaporation, vacuum heat, drying and processing using light.

CONCLUSION

Although specific embodiments of media and printers have been illustrated and described herein, it is manifestly intended that this invention be limited only by the following claims and equivalents thereof.

What is claimed is:

1. A method of forming an image on a medium comprising:

applying a plurality of microstructures to the medium, the microstructures having a given optical characteristic, the microstructures having associated therewith a radiation antenna;

directing a radiation source onto the medium such that the radiation antenna absorbs energy from the radiation source, thereby raising the temperature of the microstructures to a level at which the given optical characteristic thereof is modified;

wherein the microstructures and the radiation antenna are deposited on the medium in a single layer; and applying multiple layers to the medium, each of the respective multiple layers having a radiation antenna attuned to a range of wavelengths that differs from the ranges of wavelengths to which the radiation antennae of the remaining respective multiple layers are attuned.

2. The method of forming an image on a medium of claim 1 wherein the radiation source is a laser adapted to output radiation at a predetermined range of wavelengths to which the radiation antenna is sensitive.

3. The method of forming an image on a medium of claim 1 wherein the microstructures of the respective multiple layers are discrete structures having the given optical characteristic and which are chosen from a group consisting of grating lines, capsules, composite films, beads, chips, voids, bubbles, and crystals.

4. The method of forming an image on a medium of claim 1 wherein the microstructures and the radiation antenna of the respective multiple layers are deposited in a single step.

5. The method of forming an image on a medium of claim 1 wherein one or more of the multiple layers is at least partially transmissive to light output by the radiation source.

6. The method of forming an image on a medium of claim 1 further comprising forming a coating on at least one surface of the medium before applying multiple layers to the medium.

7. The method of forming an image on a medium of claim 1 wherein each of the respective multiple layers comprise a microstructure having an optical characteristic distinct from that of the microstructures of the remaining multiple layers.

8. The method of forming an image on a medium of claim 1 wherein the optical characteristic of the microstructures of the respective multiple layers is selected from a group consisting of color, scattering, diffusion, diffraction, interference and iridescence.

9. A medium for laser imaging comprising a substrate having a coating applied to a surface thereof, the coating comprising a radiation antenna adapted to absorb radiation within a predetermined range of wavelengths and a plurality of microstructures, the microstructures having a predetermined heat-modifiable optical characteristic;

wherein the medium comprises multiple coatings; and wherein the multiple coatings are formed one over the other and wherein each of the coatings includes a radiation antenna and a plurality of microstructures that are different from those of the remaining coatings.

10. The medium for laser imaging of claim 9 further comprising a coating that includes a curable polymer that is cured by radiation within a range of wavelengths that is outside of the range of wavelengths absorbed by the radiation antenna.

11. The medium for laser imaging of claim 9 wherein the microstructures of the respective coatings are chosen from a group consisting of grating lines, capsules, composite films, beads, chips, voids, bubbles, crystals, and three dimensional shapes.

12. The medium for laser imaging of claim 11 wherein the optical characteristic of the microstructures of the respective coatings is chosen from a group consisting of color, scattering, diffusion, diffraction, interference and iridescence.

13. The medium for laser imaging of claim 9 wherein the microstructures of each of the multiple coatings has a different optical characteristic.

14. A medium for laser imaging comprising a substrate having a first coating applied to a surface thereof, the coating comprising a radiation antenna adapted to absorb radiation within a predetermined range of wavelengths and a second coating that comprises a plurality of microstructures, the microstructures having a predetermined heat-modifiable optical characteristic, the second coating being at least partially transmissive with respect to light within the predetermined range of wavelengths;

wherein the medium comprises multiple layers of the first and second coatings; and wherein the radiation antenna and the plurality of microstructures of each of the first and second layers that comprise the multiple layers are different from those of the remaining layers of first and second coatings.

15. The medium for laser imaging of claim 14 further comprising a coating that includes a curable polymer that is cured by radiation within a range of wavelengths that is outside of the range of wavelengths absorbed by the radiation antenna.

16. The medium for laser imaging of claim 14 wherein the microstructures of the second coating are chosen from a group consisting of grating lines, capsules, composite films, beads, chips, voids, bubbles, crystals, and three dimensional shapes.

17. The medium for laser imaging of claim 16 wherein the optical characteristic of the microstructures is chosen from a group consisting of color, scattering, diffusion, diffraction, interference and iridescence.

18. The medium for laser imaging of claim 14 wherein the microstructures of each of the multiple layers has a different optical characteristic.

19. The medium for laser imaging of claim 14 wherein the microstructures of the second coating comprise discrete structures incorporated into the second coating.

* * * * *

UNITED STATES PATENT AND TRADEMARK OFFICE

CERTIFICATE OF CORRECTION

PATENT NO. : 7,270,929 B2 
APPLICATION NO. : 11/065554
DATED : September 18, 2007
INVENTOR(S) : David M Kwasny et al.

It is certified that error appears in the above-identified patent and that said Letters Patent is hereby corrected as shown below:

In column 9, line 66, delete "]-11-cyclohexen" and insert -- ]-1-cyclohexen --, therefor.

Signed and Sealed this

Twelfth Day of August, 2008

JON W. DUDAS
*Director of the United States Patent and Trademark Office*